United States Patent [19]

Ohmichi et al.

[11] 4,449,063
[45] May 15, 1984

[54] LOGIC CIRCUIT WITH IMPROVED SWITCHING

[75] Inventors: Hitoshi Ohmichi; Hiromu Enomoto, both of Kawasaki; Yasushi Yasuda, Inagi; Yoshiharu Mitono, Tokyo; Taketo Imaizumi, Fukuoka, all of Japan

[73] Assignee: Fujitsu Limited, Kawasaki, Japan

[21] Appl. No.: 180,452

[22] Filed: Aug. 22, 1980

[30] Foreign Application Priority Data

Aug. 29, 1979 [JP] Japan ................................ 54-110074
Aug. 29, 1979 [JP] Japan ................................ 54-110075

[51] Int. Cl.³ .................. H03K 19/013; H03K 19/088
[52] U.S. Cl. ...................................... 307/456; 307/280
[58] Field of Search ............................... 307/456-458, 307/280, 300, 559, 561

[56] References Cited

U.S. PATENT DOCUMENTS

| | | | |
|---|---|---|---|
| 3,602,735 | 8/1971 | Lodi | 307/456 |
| 3,610,962 | 10/1971 | Meyer et al. | 307/559 X |
| 3,641,362 | 2/1972 | Gamble | 307/456 |
| 3,845,405 | 10/1974 | Leidich | 307/300 X |
| 4,092,551 | 5/1978 | Howard et al. | 307/456 X |
| 4,118,640 | 10/1978 | Ochi et al. | 307/280 X |
| 4,131,808 | 12/1978 | Kuo | 307/270 |
| 4,132,906 | 1/1979 | Allen | 307/300 X |
| 4,321,490 | 3/1982 | Bechdolt | 307/456 |
| 4,330,723 | 5/1982 | Griffith | 307/456 |

Primary Examiner—Larry N. Anagnos
Assistant Examiner—David R. Hudspeth
Attorney, Agent, or Firm—Staas & Halsey

[57] ABSTRACT

A fundamental logic circuit used, for example, in an electronic computer, comprising an output inverter transistor and a switching transistor which discharges a base charge stored in a storage capacitance in a base-emitter junction of the output inverter transistor when the output inverter transistor changes from the turned on condition to the turned off condition.

6 Claims, 9 Drawing Figures

Fig. 1
PRIOR ART
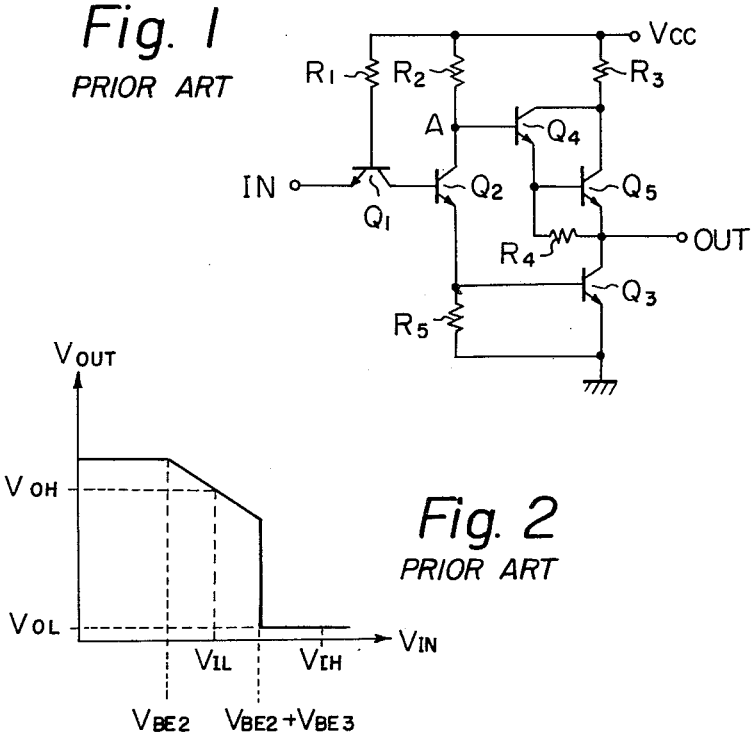
Fig. 2
PRIOR ART
Fig. 3
PRIOR ART
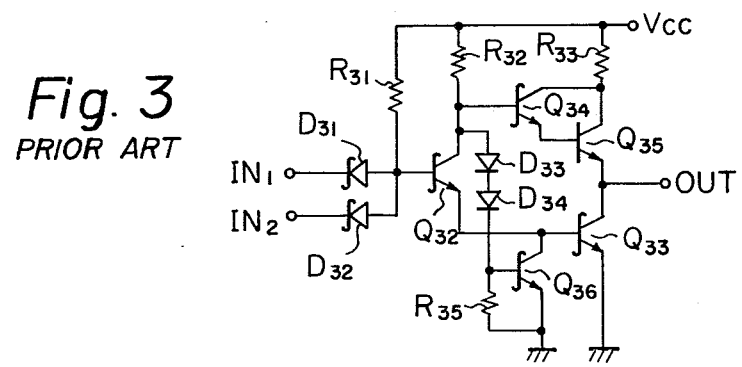

LOGIC CIRCUIT WITH IMPROVED SWITCHING

BACKGROUND OF THE INVENTION (1) Field of the Invention

The present invention relates to a fundamental logic circuit and, more particularly, to a high speed fundamental logic circuit used, for example, in an electronic computer.

(2) Description of the Prior Art

In a fundamental logic circuit such as an inverter or a NAND gate having an output inverter transistor whose emitter electrode is grounded, one of the most important factors influencing the operating speed of the fundamental logic circuit is the turn off time of the output inverter transistor. In order to reduce the turn off time of the output inverter transistor, it is necessary to quickly discharge the charge stored in the base region of the output inverter transistor.

FIG. 1 illustrates a TTL inverter circuit as an example of a conventional fundamental logic circuit which has an output inverter transistor. In FIG. 1, an input transistor $Q_1$ is an NPN type transistor which switches current flowing from the positive voltage source $V_{cc}$ through a resistor $R_1$ to the base electrode of the input transistor $Q_1$ to an input terminal IN or to the base electrode of a driver transistor $Q_2$. The driver transistor $Q_2$ is an NPN type transistor which outputs both inverted and non-inverted signals of an input signal applied to the input terminal IN. An output inverter transistor $Q_3$ is an NPN type transistor which is driven by an output signal from the emitter electrode of the driver transistor $Q_2$. Transistors $Q_4$ and $Q_5$ are both NPN type transistors which constitute a Darlington transistor driven by an output signal from the collector electrode of the driver transistor $Q_2$. The transistor $Q_5$ serves as a level shift circuit which provides a potential difference between the emitter electrode of the transistor $Q_4$ and the collector electrode of the output inverter transistor $Q_3$, i.e., the output terminal OUT, and the level shift circuit can be replaced by a diode connected therebetween. The output inverter transistor $Q_3$ and the Darlington transistor consisting of the transistors $Q_4$ and $Q_5$ constitute an output stage having a so-called totem-pole structure.

The TTL inverter circuit of FIG. 1 is well known and, therefore, the general description of the operation thereof is omitted herein, and the operation thereof will be described for a condition wherein the output potential of the output terminal OUT changes from low (i.e. about 0.4 V) to high (i.e. about 3.4 V, which is the potential of the voltage source $V_{cc}-2\ V_{BE}$). When the potential of the input terminal IN changes from high to low, the driver transistor $Q_2$ changes from the turned on condition to the turned off condition. Therefore, the potential of a point A, i.e., the collector electrode of the transistor $Q_2$ changes from low to high, and the potential of the emitter electrode of the transistor $Q_2$ changes from high to low. Accordingly, the transistor $Q_3$ begins to change from the turned on condition to the turned off condition. However, turning off of the transistor $Q_3$ is not complete until the base charge stored in the base region of the transistor $Q_3$ is discharged and the transistor $Q_3$ remains in the turned on condition until the base charge is completely discharged. In order to discharge the base charge stored in the base region of the transistor $Q_3$, a resistor $R_5$ is connected between the base electrode and the emitter electrode (i.e. the ground) of the transistor $Q_3$, so that a discharge path is constituted. Therefore, although the discharge time of the base charge can be reduced by decreasing the resistance value of the resistor $R_5$, it is impossible to greatly decrease the resistance value of the resistor $R_5$. This is because, when the transistor $Q_3$ is turned on, the resistor $R_5$ provides a bypass for the base current of the transistor $Q_3$ to the ground, and if the resistance value of the resistor $R_5$ is very small, the base current becomes too small to turn on the transistor $Q_3$ completely. Therefore, in the logic circuit of FIG. 1, the turn off time of the output inverter transistor $Q_3$ cannot be very small.

Moreover, the conventional logic circuit of FIG. 1 has the disadvantage of having a poor transfer characteristic as shown in FIG. 2. Assume that the input potential $V_{IN}$ of the input terminal IN increases from low to high gradually. When the input potential $V_{IN}$ increases in the range from $V_{BE2}$ to $V_{BE2}+V_{BE3}$, the potential of the base electrode of the driver transistor $Q_2$ also increases from $V_{BE2}$ to $V_{BE2}+V_{BE3}$. Wherein, $V_{BE2}$ designates the base-emitter voltage of the transistor $Q_2$ and $V_{BE3}$ designates the base-emitter voltage of the transistor $Q_3$. In this condition, the driver transistor $Q_2$ begins to change from the turned off condition to the turned on condition, so that the current passing through a resistor $R_2$, the main current path of the driver transistor $Q_2$ and the resistor $R_5$ increases gradually. In this condition, the potential of the point A, i.e., the collector electrode of the driver transistor $Q_2$, falls gradually and, therefore, the potential of the output terminal OUT falls gradually. This is because the transistors $Q_4$ and $Q_5$ are in the turned on condition and the output inverter transistor $Q_3$ is still in the turned off condition, and the potential of the point A is transferred to the output terminal OUT through the base emitter junctions of the transistors $Q_4$ and $Q_5$. Therefore, in the input potential range from $V_{BE2}$ to $V_{BE2}+V_{BE3}$, the transfer characteristic of the conventional logic circuit is not sharp as illustrated in FIG. 2. After the input potential $V_{IN}$ becomes larger than $V_{BE2}+V_{BE3}$, the inverter transistor $Q_3$ turns on and the output potential $V_{OUT}$ falls to a low level (i.e. about 0.4 V) quickly.

FIG. 3 illustrates a two input DTL NAND gate circuit as another example of a conventional fundamental logic circuit. The circuit of FIG. 3 comprises a diode gate consisting of Schottky barrier diodes (hereinafter referred to as SBD), $D_{31}$ and $D_{32}$, and a resistor $R_{31}$. Transistors $Q_{34}$ and $Q_{35}$, which constitute a Darlington transistor, are driven by an output signal from the collector electrode of a driver transistor $Q_{32}$, and an output inverter transistor $Q_{33}$ is driven by an output signal from the emitter electrode of the driver transistor $Q_{32}$. The Darlington transistor consisting of the transistors $Q_{34}$ and $Q_{35}$, and the output inverter transistor $Q_{33}$ constitute a totem-pole output stage. The NAND gate circuit of FIG. 3 also comprises a switching transistor $Q_{36}$ in order to quickly discharge the base charge stored in the base region of the output inverter transistor $Q_{33}$, so that the turn off time of the transistor $Q_{33}$ is reduced. The base electrode of the switching transistor $Q_{36}$ is connected to the collector electrode of the driver transistor $Q_{32}$ through diodes $D_{33}$ and $D_{34}$, and to the ground through a resistor $R_{35}$.

Operation of the switching transistor $Q_{36}$ will now be described. When the input potential $V_{IN1}$ and $V_{IN2}$ of both input terminals $IN_1$ and $IN_2$ are high, the driver transistor $Q_{32}$ is turned on and the output inverter transistor Q$_{33}$ is turned on. Therefore, the potential of the collector electrode of the driver transistor Q$_{32}$ is low, so that the transistors Q$_{34}$ and Q$_{35}$ are both turned off and the potential of the output terminal is low. In this condition, the diodes D$_{33}$ and D$_{34}$ are turned off, and therefore, the switching transistor Q$_{36}$ is turned off.

Assume that the input potential of at least one of the input terminals IN$_1$ and IN$_2$ changes to low, then the driver transistor Q$_{32}$ turns off so that the potential of the collector electrode of the transistor Q$_{32}$ becomes high. Therefore, the transistors Q$_{34}$ and Q$_{35}$ are turned on, and the output inverter transistor Q$_{33}$ is turned off. In this condition, current flows from the collector electrode of the driver transistor Q$_{32}$ through the diodes D$_{33}$ and D$_{34}$ to the base electrode of the switching transistor Q$_{36}$, and to the ground through a resistor R$_{35}$. Therefore, the switching transistor Q$_{36}$ turns on and quickly discharges the base charge stored in the base region of the output inverter transistor Q$_{33}$, so that the turn off time of the output inverter transistor Q$_{33}$ is reduced.

However, the conventional logic circuit of FIG. 3 has the following disadvantages.

(1) The threshold voltage V$_{TH}$ of each of the input potentials V$_{IN1}$ and V$_{IN2}$ is as follows.

$$V_{TH} = V_{CE36} + V_{BE32} - V_F \approx 0.8 \text{ V} \qquad (1)$$

Where V$_{CE36}$ is a saturated collector-emitter voltage (i.e. about 0.4 V) of the switching transistor Q$_{36}$, V$_{BE32}$ is a base-emitter voltage (i.e. about 0.8 V) of the driver transistor Q$_{32}$ and V$_F$ is a forward biased voltage (i.e. about 0.4 V) of the diode D$_{31}$ or D$_{32}$. Therefore, the threshold voltage V$_{TH}$ becomes about 0.8 V, and is smaller than that of a usual TTL gate circuit, so that the logic circuit of FIG. 3 has a poor noise immunity.

(2) The current flows from the positive voltage source V$_{cc}$ through the resistor R$_{32}$, the diodes D$_{33}$ and D$_{34}$, and the resistor R$_{35}$ and the base-emitter junction of the switching transistor Q$_{36}$ to the ground all the time the driver transistor Q$_{32}$ is in the turned off condition. Therefore, the power consumption of the logic circuit is large.

(3) The logic circuit of FIG. 3 uses a large number of semiconductor elements and, therefore, the circuit occupies a relatively large area in an integrated circuit.

Examples of a prior art fundamental logic circuit having an output inverter transistor are disclosed in the publication "The TTL Data Book for Design Engineers" First Edition, by Texas Instruments Incorporated, 1973, P. 87 or P. 89.

SUMMARY OF THE INVENTION

It is an object of the present invention to decrease the turn off time of the output inverter transistor from that of the conventional fundamental logic circuit so that the operating speed of the fundamental logic circuit is increased over that of the conventional logic circuit.

It is another object of the present invention to improve the transfer characteristic of a fundamental logic circuit.

It is still another object of the present invention to decrease the power consumption of the high speed fundamental logic circuit.

It is further object of the present invention to reduce the area occupied by a fundamental logic circuit from the area occupied by the conventional fundamental logic circuit in an integrated circuit.

According to the present invention, there is provided a fundamental logic circuit comprising a switching transistor which discharges the base charge stored in the base region of an output inverter transistor when the output inverter transistor changes from the turned on condition to the turned off condition.

BRIEF DESCRIPTION OF THE DRAWINGS

FIG. 1 is a circuit diagram illustrating a TTL inverter circuit as an example of a conventional fundamental logic circuit.

FIG. 2 illustrates a transfer characteristic of the TTL inverter circuit of FIG. 1.

FIG. 3 is a circuit diagram illustrating a two input DTL NAND gate as another example of a conventional fundamental logic circuit.

DESCRIPTION OF THE PREFERRED EMBODIMENTS

Figure 4:
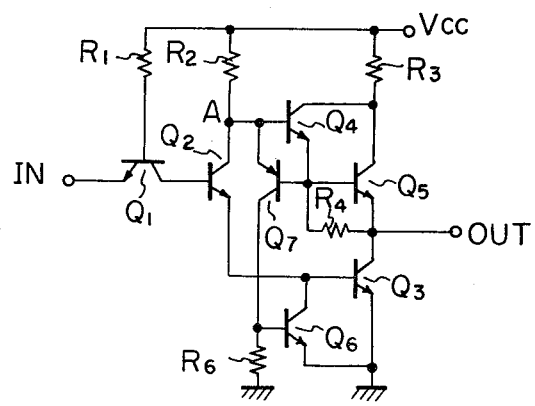
FIG. 4 is a circuit diagram illustrating a TTL inverter circuit as a first embodiment of the present invention.

With reference to FIGS. 4 through 9, the present invention will now be described. FIG. 4 illustrates a TTL inverter circuit as a first embodiment of the present invention. In FIG. 4, the same parts as appear in FIG. 1 are designated by the same reference symbols, and the explanation thereof is omitted herein. The logic circuit of FIG. 4 does not use the resistor R$_5$ of FIG. 1 and comprises a first switching transistor Q$_6$ of NPN type, whose main current path is connected between the base electrode and the emitter electrode of the output inverter transistor Q$_3$, and which discharges the base charge stored in the base region of the transistor Q$_3$. The logic circuit of FIG. 4 also comprises a second switching transistor Q$_7$ of PNP type, whose main current path is connected between the base electrode of the first switching transistor Q$_6$ and the collector electrode of the driver transistor Q$_2$, and whose base electrode is connected to the emitter electrode of the transistor Q$_4$ connected to the base electrode of the transistor Q$_5$. The collector electrode of the second switching transistor Q$_7$, which is connected to the base electrode of the first switching transistor Q$_6$, is connected to the ground through a resistor R$_6$.

As aforementioned, when the input potential V$_{IN}$ of the input terminal IN changes from high to low, the driver transistor Q$_2$ is turned off and the potential of the collector electrode of the driver transistor Q$_2$ (i.e. point A) changes from low to high. Accordingly, the output inverter transistor Q$_3$ starts to change from the turned on condition to the turned off condition, so that the output potential V$_{OUT}$ starts to change from low (i.e. about 0.4 V) to high. Before the output potential V$_{OUT}$ becomes high, a potential difference exists between the point A and the output terminal OUT, and therefore, a transient current flows from the point A through the base-emitter junction of the transistor $Q_4$ and through the base-emitter junction of the transistor $Q_5$ to the main current path of the output inverter transistor $Q_3$, so that the transistors $Q_4$ and $Q_5$ are turned on.

A part of the transient current flows, according to the present invention, through the second switching transistor $Q_7$ and the first switching transistor $Q_6$. That is, the second switching transistor $Q_7$ is supplied with the base current by the above-mentioned potential difference and is turned on. Therefore, a current passes from the point A through the main current path of the second switching transistor $Q_7$ to the base electrode of the first switching transistor $Q_6$, so that the first switching transistor $Q_6$ is turned on. When the first switching transistor $Q_6$ is so turned on, the base charge stored in the base region of the transistor $Q_3$ is discharged through the main current path of the first switching transistor $Q_6$. Therefore, the turn off time of the output inverter transistor $Q_3$ is reduced and the output inverter transistor $Q_3$ is turned off quickly, thereby changing the output potential $V_{OUT}$ to high. In response to the change of the output potential $V_{OUT}$ from low to high, the second switching transistor $Q_7$ turns off and, thus, the first switching transistor $Q_6$ is turned off. Therefore, the transistors $Q_6$ and $Q_7$ is turned on only for a short time and steady current consumption of the logic circuit of FIG. 4 is reduced.

Figure 5:
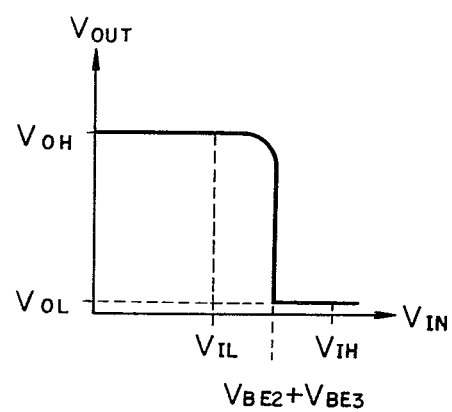
FIG. 5 illustrates a transfer characteristic of the TTL inverter circuit of FIG. 4.

FIG. 5 illustrates the transfer characteristic of the logic circuit of FIG. 4. As illustrated in FIG. 5, the logic circuit of FIG. 4 has a sharper transfer characteristic than that of the conventional logic circuit of FIG. 1 illustrated in FIG. 2. When the input potential $V_{IN}$ changes from low to high, the driver transistor $Q_2$ is turned on. However, since the logic circuit of FIG. 4 does not have the resistor $R_5$, contained in the conventional logic circuit of FIG. 1, the driver transistor $Q_2$ turns on at substantially the same time as the turn on of the output inverter transistor $Q_3$ after the input potential has reached to the level of $V_{BE2}+V_{BE3}$. Therefore, the potential of the point A remains substantially at high level until the input potential $V_{IN}$ reaches the level of $V_{BE2}+V_{BE3}$, and after the input potential has reached to the level of $V_{BE2}+V_{BE3}$, the potential of the point A falls to low quickly, and thus, the output potential $V_{OUT}$ falls to low quickly. Consequently, the transfer characteristic of the logic circuit of FIG. 4 becomes very sharp.

Figure 6:
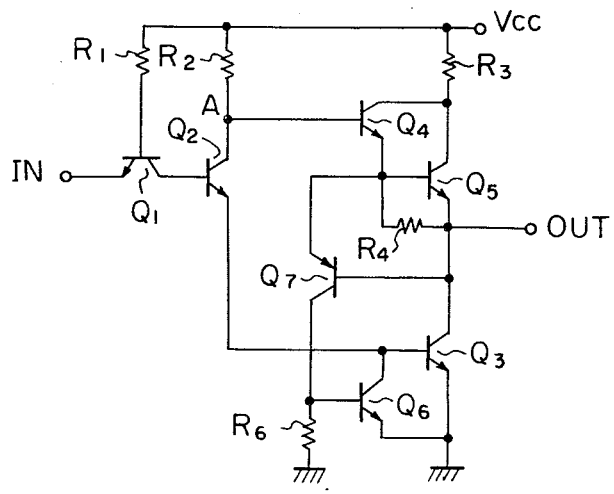
FIG. 6 is a circuit diagram illustrating a TTL inverter circuit as a second embodiment of the present invention.

FIG. 6 illustrates a TTL inverter circuit as a second embodiment of the present invention. The TTL inverter circuit of FIG. 6 also comprises the first switching transistor $Q_6$ and the second switching transistor $Q_7$, as in the TTL inverter circuit of FIG. 4. However, the emitter electrode of the second switching transistor $Q_7$ is connected to the emitter electrode of the transistor $Q_4$, which is connected to the base electrode of the transistor $Q_5$, and the base electrode of the second switching transistor $Q_7$ is connected to the output terminal OUT. The other parts of the circuit are the same as that of the circuit of FIG. 4.

In the TTL inverter circuit of FIG. 6, the second switching transistor $Q_7$ is turned on temporarily by a part of the transient current flowing from the point A through the base-emitter junction of the transistor $Q_4$ when the input potential $V_{IN}$ changes from high to low. The other operation of the TTL inverter circuit of FIG. 6 is the same as that of the TTL inverter circuit of FIG. 4. Therefore, the turn off time of the output inverter transistor $Q_3$ is reduced, and the TTL inverter circuit of FIG. 6 has a sharp transfer characteristic as illustrated in FIG. 5.

Figure 7:
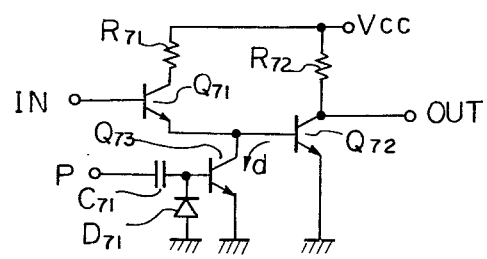
FIG. 7 is a circuit diagram illustrating a fundamental logic circuit as a third embodiment of the present invention.

FIG. 7 illustrates a TTL inverter circuit as a third embodiment of the present invention. The TTL inverter circuit of FIG. 7 comprises a driver transistor $Q_{71}$, whose base electrode is connected to the input terminal IN and whose collector electrode is connected to the positive voltage source $V_{cc}$ through a resistor $R_{71}$. The TTL inverter circuit of FIG. 7 also comprises an output inverter transistor $Q_{72}$, whose base electrode is connected to the emitter electrode of the driver transistor $Q_{71}$, whose emitter electrode is grounded and whose collector electrode is connected to the output terminal OUT and to the positive voltage source $V_{cc}$ through a resistor $R_{72}$. The TTL inverter circuit of FIG. 7 comprises, according to the present invention, a switching transistor $Q_{73}$ whose main current path is connected between the base electrode and the emitter electrode of the output inverter transistor $Q_{72}$ and whose base electrode is connected, through a capacitor $C_{71}$, to a terminal P connected to a predetermined node in the circuit of FIG. 7. The switching transistor $Q_{73}$ is turned on due to the temporary supply of the base current through the capacitor $C_{71}$ when the output inverter transistor $Q_{72}$ changes from the turned on condition to the turned off condition. Therefore, the base charge stored in the base region of the output inverter transistor $Q_{72}$ is quickly discharged through the main current path of the switching transistor $Q_{73}$, as illustrated by an arrow d in FIG. 7, so that the turn off time of the output inverter transistor $Q_{72}$ is reduced. Therefore, the terminal P is connected to one of the nodes of the circuit of FIG. 7, the potential of which changes from low to high when the output inverter transistor $Q_{72}$ changes from the turned on condition to the turned off condition. For example, the terminal P is connected to the collector electrode of the driver transistor $Q_{71}$ or the collector electrode of the output inverter transistor $Q_{72}$. A diode $D_{71}$ clamps the potential of the base electrode of the switching transistor $Q_{73}$ to the ground potential, when the potential of the terminal P changes from high level to low level, and ensures quick turn on of the switching transistor $Q_{73}$ when the potential of the terminal P changes from low level to high level. If the diode $D_{71}$ is not used, the potential of the base electrode of the swtiching transistor $Q_{73}$ falls to a very low level when the potential of the terminal P has changed from high to low, and thus, there is a possibility of missing or delaying the turn on of the switching transistor $Q_{73}$.

Figure 8:
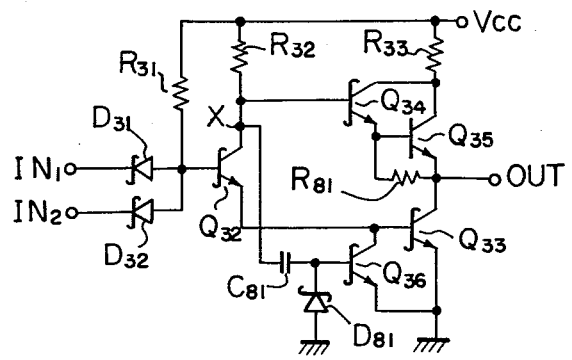
FIG. 8 is a circuit diagram illustrating a two input DTL NAND gate as a fourth embodiment of the present invention.

FIG. 8 illustrates a two input DTL NAND gate as a fourth embodiment of the present invention. The NAND gate of FIG. 8 is the same as the NAND gate of FIG. 3, except that the diodes $D_{33}$ and $D_{34}$ and the resistor $R_{35}$ included in the NAND gate of FIG. 3 are replaced by a capacitor $C_{81}$ and a Schottky barrier diode $D_{81}$. In FIG. 8, a terminal of the capacitor $C_{81}$, which corresponds to the terminal P of the circuit of FIG. 7, is connected to a node X, i.e., the collector electrode of the driver transistor $Q_{32}$. When the output inverter transistor $Q_{33}$ changes from the turned on condition to the turned off condition, the potential of the node X changes from low to high and the switching transistor $Q_{36}$ is turned on for a short time because the base current is temporarily supplied through the capacitor $C_{81}$. Therefore, the base charge stored in the base region of the output inverter transistor $Q_{33}$ is quickly discharged and, as a result, the turn off time of the output inverter transistor $Q_{33}$ is reduced.

With regard to the transfer characteristic, since the NAND gate of FIG. 8 does not have a resistor corresponding to the resistor $R_5$ contained in the conventional fundamental logic circuit of FIG. 1, the driver transistor $Q_{32}$ and the output inverter transistor $Q_{33}$ turn on or turn off at substantially the same time. Therefore, the NAND gate of FIG. 8 has as sharp a transfer characteristic as that of the logic circuit of FIG. 4.

The threshold voltage $V_{TH}$ of each of the input potentials $V_{IN1}$ and $V_{IN2}$ of the NAND gate of FIG. 8 is as given by the following equation.

$$V_{TH} = V_{BE32} + V_{BE33} - V_F \approx 1.2 \text{ V} \qquad (2)$$

where $V_{BE32}$ and $V_{BE33}$ are base-emitter voltages of the driver transistor $Q_{32}$ and the output inverter transistor $Q_{33}$, respectively, and $V_F$ is a forward biased voltage of the diode $D_{31}$ or $D_{32}$. Therefore, the threshold voltage $V_{TH}$ becomes about 1.2 V, and is higher than that of the conventional logic circuit of FIG. 3, so that a high noise immunity is obtained.

The NAND gate of FIG. 8 also has the following two advantages. One of the advantages is low power consumption in a steady state. This advantage is obtained because the base current of the switching transistor $Q_{36}$ flows only temporarily through the capacitor $C_{81}$ when the output inverter transistor $Q_{33}$ changes from the turned on condition to the turned off condition. The other of the advantages is that the NAND gate of FIG. 8 does not occupy a large area in a integrated circuit. This is because the NAND gate of FIG. 8 does not use a large number of parts and the capacitor $C_{81}$, contained in the NAND gate of FIG. 8, can be formed by using a multi layer pattern in an integrated circuit.

Figure 9:
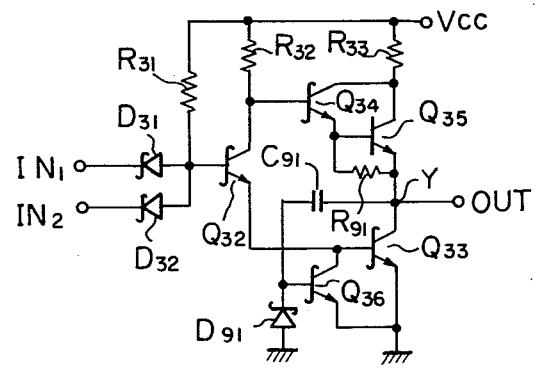
FIG. 9 is a circuit diagram illustrating another two input DTL NAND gate as a fifth embodiment of the present invention.

FIG. 9 illustrates another two input DTL NAND gate as a fifth embodiment of the present invention. The NAND gate of FIG. 9 is the same as the NAND gate of FIG. 8, except that the terminal of a capacitor $C_{91}$, which corresponds to the capacitor $C_{81}$ in FIG. 8, is connected to a node Y, i.e., the output terminal OUT of the NAND gate of FIG. 9. The potential of the node Y changes from low to high when the output inverter transistor $Q_{33}$ changes from the turned on condition to the turned off condition. Therefore, operation of the NAND gate of FIG. 9 is the same as that of the NAND gate of FIG. 8, and the NAND gate of FIG. 9 has the same advantages as that of the NAND gate of FIG. 8.

We claim:

1. A fundamental logic circuit for performing a fundamental logic operation comprising:
   input means for receiving an input signal:
   a driver transistor having a base electrode connected to said input means and having emitter and collector electrodes producing output signals;
   an output emitter follower transistor which is driven by the output signal from the collector electrode of said driver transistor;
   an output inverter transistor having a base electrode which is driven by the output signal from the emitter electrode of said driver transistor and which comprises a totem-pole output stage together with said output emitter follower transistor;
   a first switching transistor which is connected between the base electrode of said output inverter transistor and ground, and which removes any base charge from the base of said output inverter transistor; and
   a second switching transistor whose collector is connected to the base electrode of said first switching transistor and whose emitter electrode and base electrode are connected between two nodes of said fundamental logic circuit, the potential difference between said two nodes increasing only during a transient period in which said output inverter transistor changes from the turned on condition to the turned off condition, and said first and second switching transistors being turned on temporarily in said transient period.

2. A fundamental logic circuit as set forth in claim 1, wherein said nodes of said fundamental logic circuit are the collector electrode of said driver transistor and the emitter electrode of said output emitter follower transistor, the base electrode of said second switching transistor being connected to the emitter electrode of said output emitter follower transistor.

3. A fundamental logic circuit as set forth in claim 1, wherein said output emitter follower transistor is a Darlington transistor consisting of first and second transistors, the emitter electrode of said first transistor being connected to the base electrode of said second transistor, collector electrodes of said first and second transistors being connected commonly to each other.

4. A fundamental logic circuit as set forth in claim 3, wherein said nodes of said fundamental logic circuit are the collector electrode of said driver transistor and the emitter electrode of said first transistor comprising said Darlington transistor, the base electrode of said second switching transistor being connected to the emitter electrode of said first transistor comprising said Darlington transistor.

5. A fundamental logic circuit as set forth in claim 3, wherein said nodes of said fundamental logic circuit are the emitter electrode of said first transistor comprising said Darlington transistor and the output terminal of said fundamental logic circuit, the base electrode of said second switching transistor being connected to an output terminal of said fundamental logic circuit.

6. A fundamental logic circuit as set forth in claim 1, 2, 3, 4 or 5 wherein said driver transistor, said output emitter follower transistor, said output inverter transistor and said first switching transistor are NPN type transistors, and said second switching transistor is a PNP type transistor.

* * * * *

UNITED STATES PATENT AND TRADEMARK OFFICE
CERTIFICATE OF CORRECTION

PATENT NO. : 4,449,063

DATED : May 15, 1984

INVENTOR(S) : Hitoshi Ohmichi et al

It is certified that error appears in the above-identified patent and that said Letters Patent is hereby corrected as shown below:

Front page, [54] before "LOGIC", insert --A--.

Column 1, line 1, before "LOGIC", insert --A--.

Column 3, line 65, after "is", insert --a--.

Column 7, line 34, "a", second occurrence, should be --an--;

line 57, ":" should be --;--.

Signed and Sealed this

Sixth Day of November 1984

[SEAL]

Attest:

GERALD J. MOSSINGHOFF

Attesting Officer

Commissioner of Patents and Trademarks